United States Patent [19]
Bright et al.

[11] Patent Number: 5,130,552
[45] Date of Patent: Jul. 14, 1992

[54] IMPROVED ION IMPLANTATION USING A VARIABLE MASS RESOLVING SYSTEM

[75] Inventors: Nicholas Bright, Southwater; David R. Burgin, Horsham; Timothy G. Morgan, Pinner; Craig J. Lowrie; Hiroyuki Ito, both of Horsham, all of England

[73] Assignee: Applied Materials, Inc., Santa Clara, Calif.

[21] Appl. No.: 628,795

[22] Filed: Dec. 17, 1990

[51] Int. Cl.5 .............................. H01J 37/317
[52] U.S. Cl. ................... 250/492.2; 250/397; 250/398
[58] Field of Search ........... 250/492.2 R, 492.21, 250/492.23, 397, 398

[56] References Cited

U.S. PATENT DOCUMENTS

| | | | |
|---|---|---|---|
| 4,498,833 | 2/1985 | Hertel | 250/492.2 |
| 4,667,111 | 5/1987 | Glavish et al. | 250/492.21 |
| 4,743,767 | 5/1988 | Plumb et al. | 250/492.2 |
| 4,754,200 | 6/1988 | Plumb et al. | 315/111.81 |
| 4,757,208 | 7/1988 | McKenna et al. | 250/492.2 |
| 4,881,010 | 11/1989 | Jetter | 250/492.21 |
| 5,025,167 | 6/1991 | Okuda et al. | 250/492.2 |

Primary Examiner—Jack I. Berman
Assistant Examiner—James Beyer
Attorney, Agent, or Firm—Birgit E. Morris

[57] ABSTRACT

An ion implantation system is modified to allow variation in the size of the aperture of the mass resolving system, thereby allowing more ions of one mass or ion of more than one mass, such as isotopes, to pass through said opening. Including all isotopes of the desired dopant ions to be collected increases beam current, and consequently the throughput of the implantation process, reduces contamination, and improves the dosage control.

9 Claims, 6 Drawing Sheets

ION IMPLANTER BEAM LINE

IMPROVED ION IMPLANTATION USING A VARIABLE MASS RESOLVING SYSTEM

This invention relates to improved ion beam implantation equipment. More particularly, this invention relates to means and method to improve throughput and dosage control and to reduce contamination from unwanted ions during ion implantation.

BACKGROUND OF THE INVENTION

Ion implantation is able to implant exact doses of ions in a controllable doping profile in a semiconductor wafer. Thus ion implantation has largely supplanted methods such as diffusion to manufacture devices in semiconductor wafers as the number of devices on each wafer has vastly increased (VLSI) and the feature sizes of the devices has become much smaller. Ion implantation can effect more accurate doses of the desired ions, and can exert closer control over doping profiles. Ion implantation equipment accordingly has also become more sophisticated. However, several problems remain to be addressed.

Ion implantation operates on only one wafer at a time, or on one batch of wafers on a carousel. Openings in a photoresist layer on the wafer are made where ions of a particular chemical species are to be implanted. The ion beam carrying the desired ions strikes the patterned wafer, implanting ions into the wafer in the openings in the photoresist. The photoresist acts as a stop everywhere else. In order to make devices such as CMOS devices and the like, after the first implantation is performed and the wafer is removed from the ion implanter, the photoresist is removed, a new layer of photoresist put down, repatterned to provide openings where different chemical ion species are to be implanted, and the ion implantation repeated with a different beam of ions. In order to make complex circuits, this process may be repeated several times to complete devices on a single wafer or batch of wafers.

Thus it is apparent that improving the throughput speed of the ion implantation process can save time for each implant, thereby reducing costs considerably. Means of increasing the throughput of ion implantation, without, however, sacrificing the quality of the resultant devices, would be highly desirable.

SUMMARY OF THE INVENTION

We have found that ion implantation throughput can be increased significantly by fitting conventional ion implantation equipment with a variable aperture mass resolving system. This system reduces contamination from unwanted ion species and improves dose accuracy as well.

DETAILED DESCRIPTION OF THE INVENTION

Figure 1:
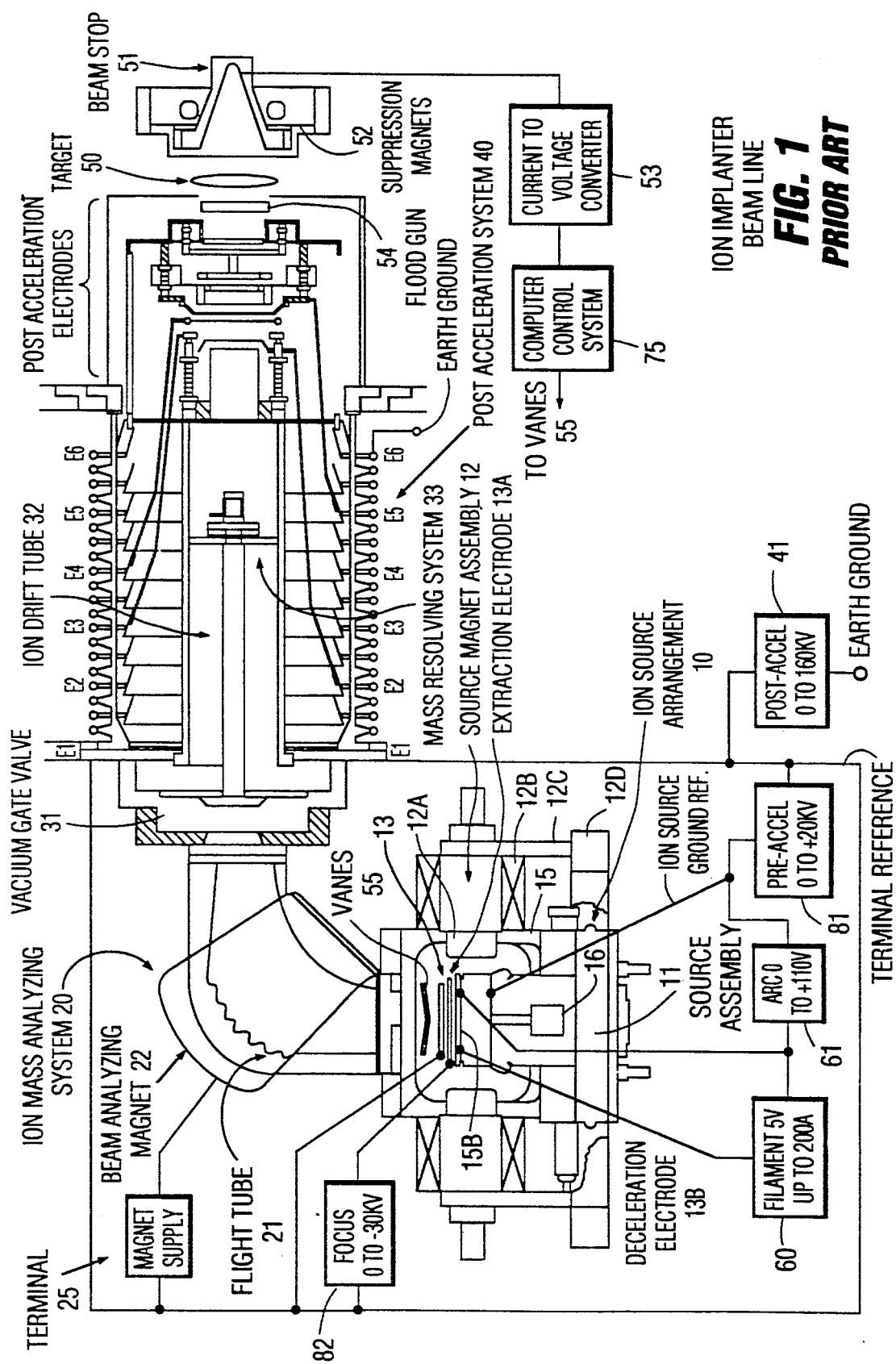
FIG. 1 is a partial sectional view of a prior art ion implant beam line which is the preferred system environment for the variable mass resolving system of the invention.
Figure 1A:
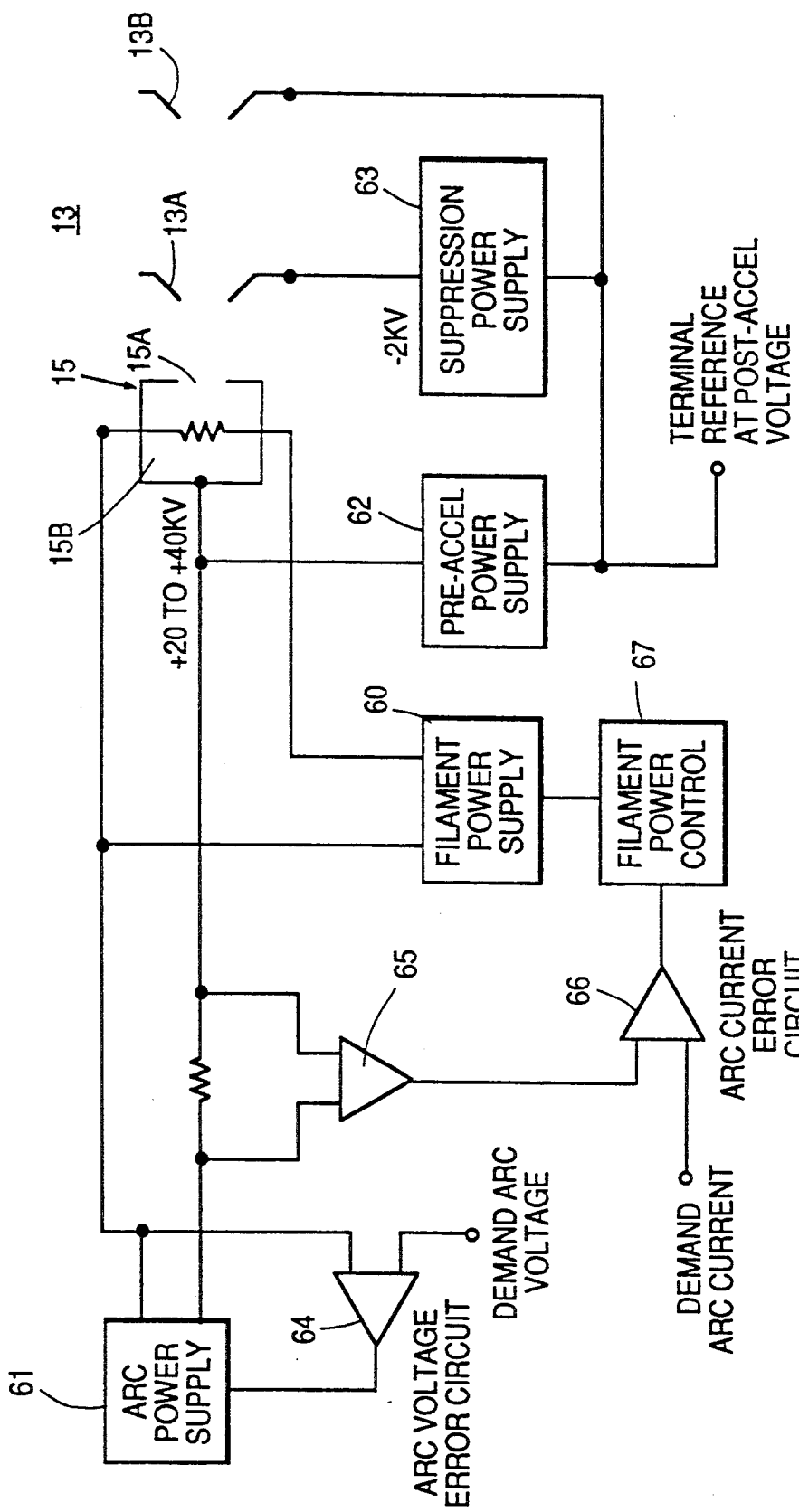
FIG. 1A is a schematic diagram of a prior art ion source control system and ion beam extraction system.

Reference will now be had to FIG. 1 and FIG. 1A for an explanation of state-of-the-art ion implantation equipment.

FIG. 1 illustrates the basic ion beam line subsystems of an ion implanter. The ion source structure and arrangement is a typical ion source arrangement. FIG. 1A schematically illustrates from a conceptual standpoint, the control of a ion source utilizing a prior art approach.

Referring to FIGS. 1 and IA, ions are generated in the arc chamber 15 of the ion source. An extraction electrode assembly 13 extracts a beam of ions through a rectangular aperture 15A in the front of the arc chamber 15. The ion beam is both extracted and accelerated toward the mass analyzing system 20 which includes an ion beam flight tube 21 providing a path between the poles of analyzing magnet assembly 22. The ion beam is bent in passing through the analyzing magnet assembly 22, enters an ion drift tube 32, passes through a mass resolving slit 33, is accelerated in a post acceleration system 40 and strikes a target element 50. During a portion of the scan cycle, the target element 50 is out of the beam, and all of the beam current falls on the beam stop 51. Suppression magnets 52 in the beam stop arrangement 51 produce a magnetic field oriented to prevent escape of secondary electrons from the beam stop and thus to ensure accurate measurement of the beam current. This suppression function is well known and need not be described in detail herein.

A flood gun arrangement shown schematically in FIG. 1 may be positioned in the vicinity of the wafer 50 to assist with neutralizing positive charges which may otherwise build up to a destructive level on the surface of the wafer. In some cases it may also be desirable to inject an inert gas into the region in front of the wafer to create a plasma in that region which may assist in neutralizing the charge build up on the wafer surface.

Ion source assembly 11 includes a magnet assembly 12 which has separate electromagnets with cylindrical poles having their axis aligned with the filament 15B within the arc chamber 15. The source magnets produce higher efficiency of ion generation by causing electrons emitted from the filament 15B to spiral around the filament in a path to the walls of the arc chamber 15 serving as the anode and thus increase the ionization efficiency in the source. However, hard driving of the source magnets can affect arc stability.

A post-acceleration supply 41 is set to a prearranged value between 0 and 160 kilovolts to determine the amount of post acceleration of the ion beam, in the post-acceleration system. This voltage also determines the terminal reference potential in terminal 25 in which is housed the ion source arrangement 10 and the mass analyzing system. All of the ion source operating voltages and the extraction system voltages are referenced to the terminal voltage set by the post-accel supply. Pre-accel supply 81 is set to a value between 0 and +20 kilovolts and that voltage is applied to the ion source chamber 15 where it serves as the ion source ground reference potential. The filament is d.c. biased to a voltage above the ion source chamber by the arc supply 61. The filament 15B is heated by passing electrical current therethrough from filament supply 60.

As shown, decel electrode 13B is directly connected to terminal potential and extraction electrode 13A and is supplied with voltage from focus supply 22 which can be set from 0 to −30 kilovolts. The ion beam is extracted from the source chamber by an extraction and accelerating field between the ion source chamber at the preset pre-accel supply potential and the extraction electrode at the preset focus supply voltage value. The value of the output of the pre-accel supply is set according to the amount of pre-acceleration of the beam that is desired. The value of the focus voltage is set during a beam tuning process to obtain the desired ion beam characteristics.

As shown in FIG. 1A, the ion source is operated from an electrical standpoint by coupling a filament power supply 60 across the filament 15B to supply high current at low voltage to the filament. An arc power supply 61 applies a voltage, which is typically clamped to a maximum of about 170 volts between the filament 15B and the arc chamber 15, with the arc chamber serving as an anode. Filament 15B generates thermal electrons which are accelerated through the gas species within the arc chamber and toward the arc chamber walls to create a plasma of the ion species within the arc chamber 15.

A separate pre-accel (or extraction) power supply 62 provides a pre-analysis acceleration voltage of up to 40 kilovolts to the arc chamber 15. A suppression power supply 63 provides a slightly negative voltage of around −2 kilovolts to extraction electrode 13A, also known as the suppression electrode. The final electrode 13B is biased at terminal ground reference so that the final ion beam pre-analysis acceleration is determined by the value of the pre-analysis acceleration voltage applied to the arc chamber itself. Terminal ground reference is the value of the post-acceleration voltage applied to the terminal and the value of that voltage determines the final ion beam energy striking the target.

When the target wafer 50 is not intercepting all of the ion beam exiting the post-acceleration region, some of the ion beam falls on the beam stop 51. When the scan wheel carrying the wafers is totally out of the ion beam, all of the ion beam is collected in the beam stop 51 and the ion beam current can be accurately measured at this time. The beam stop arrangement includes suppression magnets 52 to prevent loss of secondary electrons and to maintain current measuring accuracy. The current collected on the beam stop is fed to a current to voltage converter 53. The output of the current to voltage converter is fed to a computer control system 75 which is used to perform dose calculations. A suitable current to voltage converter 53 and dose calculation system is described in detail in Plumb et al U.S. Pat. No. 4,743,767, incorporated herein by reference in its entirety.

A flood gun arrangement 54 may be incorporated into the system to assist with avoiding charge build up on the surface of a wafer during implantation under some circumstances. The flood gun operation will also be controlled by the computer control system 75. Beam control vanes 55 in the extraction region of the ion source arrangement also function under computer control routines to apply a controlled degree of trim to the ion beam and thus to control the amount of beam current delivered to the wafer 50.

In the above-described and other prior art ion implantation equipment, the mass resolving aperture 33 is fixed.

The incorporation of isotope separator optics into ion implantation equipment has made it possible to improve mass resolution of species generated in an ion beam. For example, a phosphorous atom having a mass/charge ratio of 31 can be readily separated from oxygen molecule having a mass/charge ratio of 32. The mass resolving system separates the desired dopant ions from contamination species that would adversely affect the quality of semiconductor devices.

However, in certain other implants, particularly in the case where more than one isotope of a dopant ion are normally generated, such as isotopes of boron or antimony, by increasing the size of the mass resolving aperture, more than one isotope of the desired ion can be transmitted by the ion beam and implanted. This improves the throughput of the ion implantation process, since the beam current of boron, for example, will increase and more of the desired ions will be implanted in the wafer.

In the variable mass resolving aperture of the present invention, the aperture can be increased or decreased depending on the species of the ions to be passed through. Increasing the size of the aperture reduces mass resolution while increasing beam current; reducing the size of the aperture increases mass resolution while reducing beam current.

Figure 2:
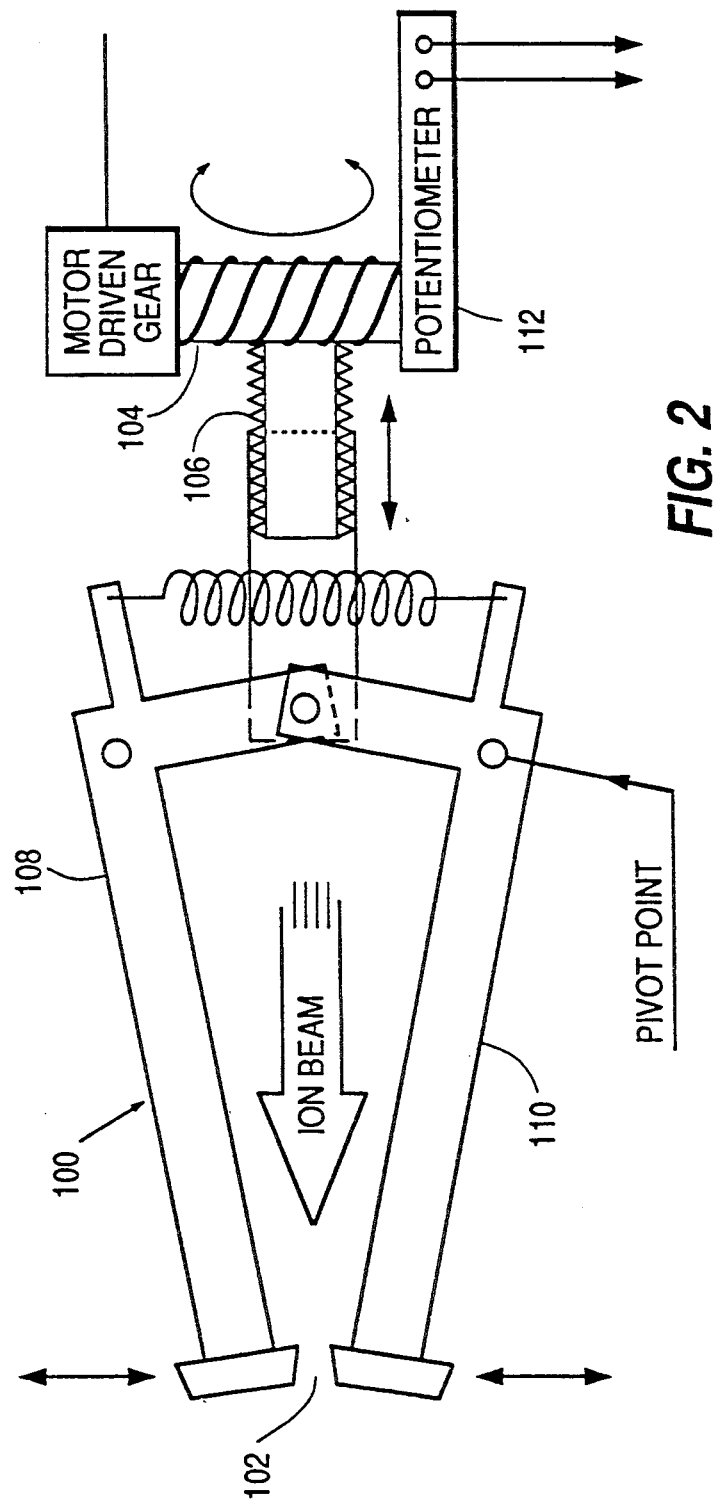
FIG. 2 is an expanded view of a variable aperture mass resolving system of the invention.

FIG. 2 illustrates a variable mass resolving aperture system of the invention.

The variable mass resolving system 100 has an aperture 102 the size of which can be varied. A motor driven gear 104 is connected to an adjustable screw 106, which in turn is connected to two spring loaded pivot arms 108 and 110. It is these arms that control the size of the aperture 102. Variations in the particular types of equipment used will readily suggest themselves to those skilled in the art. For example, for fine adjustments of the size of the opening, computer operation of the pivot arms 108 and 110 may be preferred to the mechanical means illustrated. The size of the desired aperture opening is predetermined in known manner for each ion implantation, and the pivot arms 108 and 110 adjusted accordingly. The potentiometer 112 acts to calibrate the aperture 102 with the position of the gear 104.

The invention will be further illustrated by reference to FIGS. 3, 4 and 5.

Figure 3:
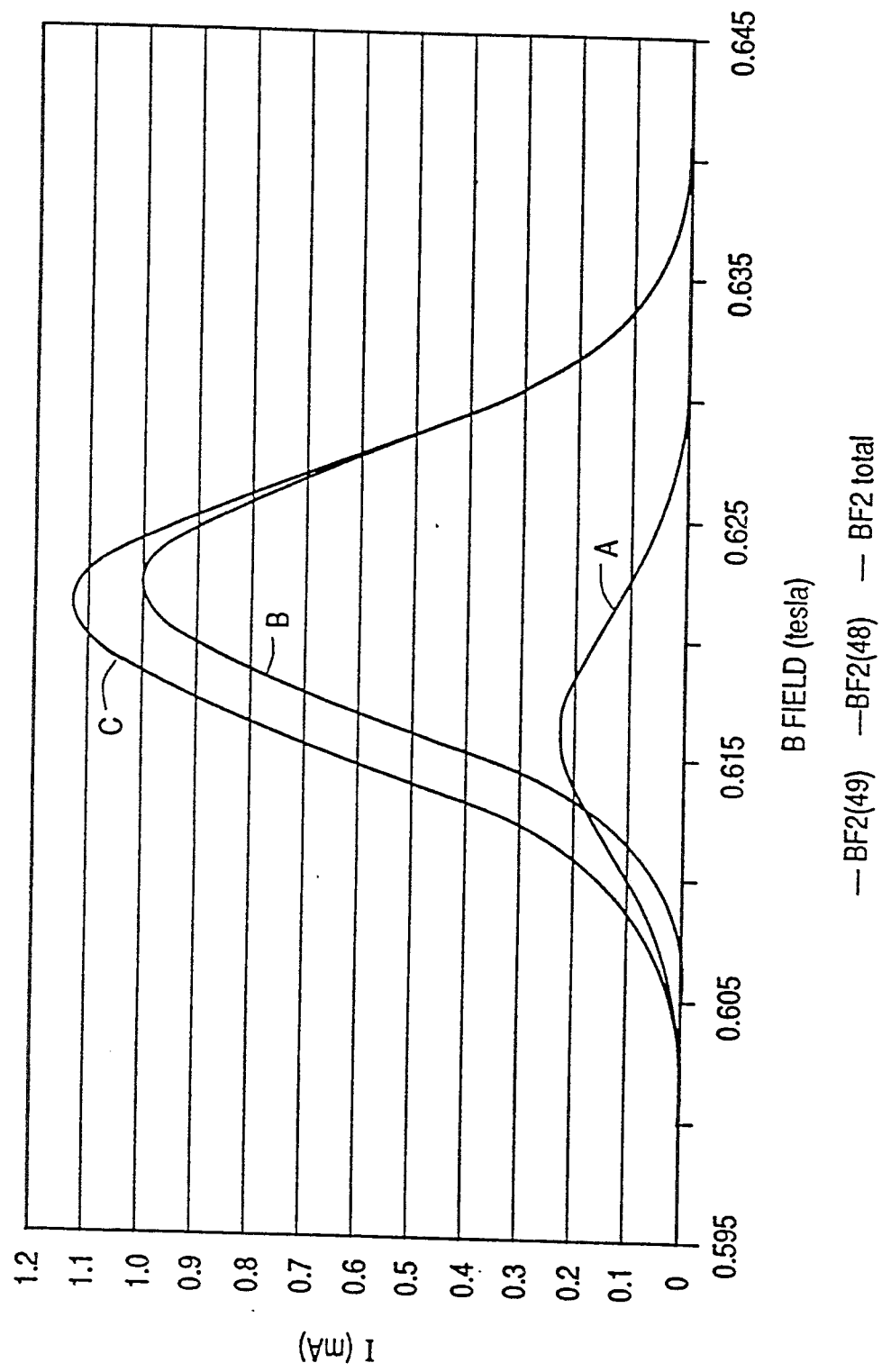
FIG. 3 is a graph showing the relative amounts of boron isotope compounds generated in an ion plasma.

FIG. 3 is a graph of $BF_2$ content resolved into $B_{10}F_2$, shown as curve A, $B_{11}F_2$, shown as curve B, and total $BF_2$, shown as curve C. By opening the slit aperture of a mass resolving system of the invention to allow both isotope compounds to pass through the aperture, the beam current is increased about 20%. In addition to increasing the throughput, this results in additional advantages as well. By allowing both $B_{10}F_2$ and $B_{11}F_2$ to pass through the aperture, the pressure on the analyzing magnet side of the aperture is decreased, and the dissociation of the $BF_2$ to produce fluorine gas is less. With fewer fluorine atoms/molecules generated, fewer boron ions are neutralized or suffer collisions in the post accel region. This reduces the charge exchange in the post acceleration region of the ion implanter, thus reducing energy contamination. Further, dose accuracy is improved. When the ion beam contains a large number of neutral atoms, which are not counted when the dose reaching the wafer is measured, in actuality more ions/atoms reach the wafer than are counted. Thus the actual count can be quite at variance with the observed ion count. This can cause substantial errors in control of overall dose of the implant, which leads to defects in the electrical characteristics of implanted regions an circuit defects that reduce the yield of devices on the wafer. Thus, by reducing the number of neutral atoms in the ion beam, dose measuring accuracy is improved.

Figure 4:
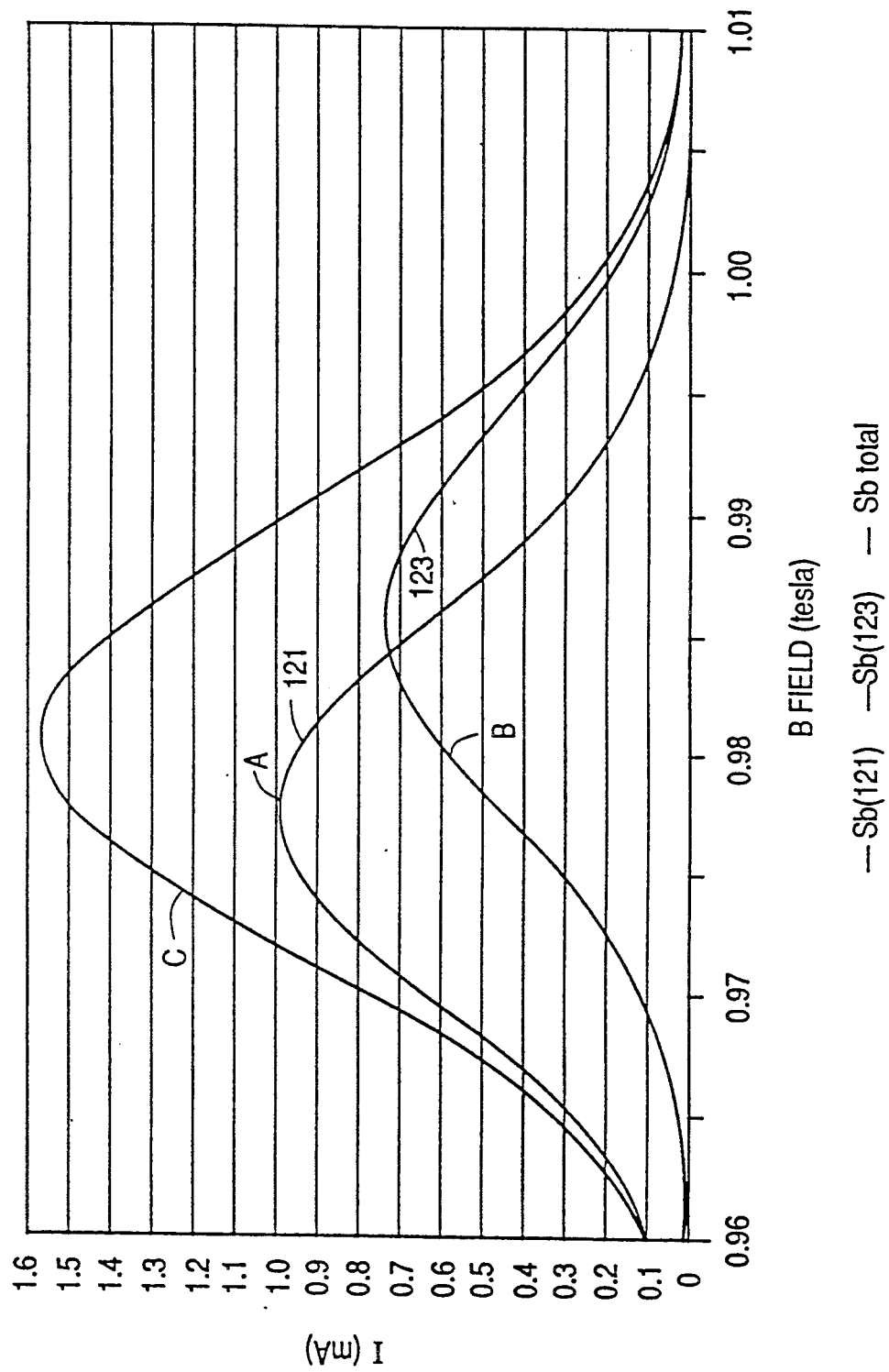
FIG. 4 is a graph showing the relative amounts of antimony isotopes generated in an ion plasma.

FIG. 4 is a graph of the total antimony content in a generated ion beam. Curve A is antimony 121 and curve B is antimony 123. The total antimony is shown as curve C. By allowing both antimony ion species to be passed through the mass resolving system and be implanted, the beam current is substantially increased.

Arsenic beam currents tend to be difficult to focus at low energies (<40 keV) because the mass is large (75) and the beam tends to grow due to electrostatic forces. By halving the resolving power for arsenic, the beam current will increase by about 40% without an increase in contaminant species.

Figure 5:
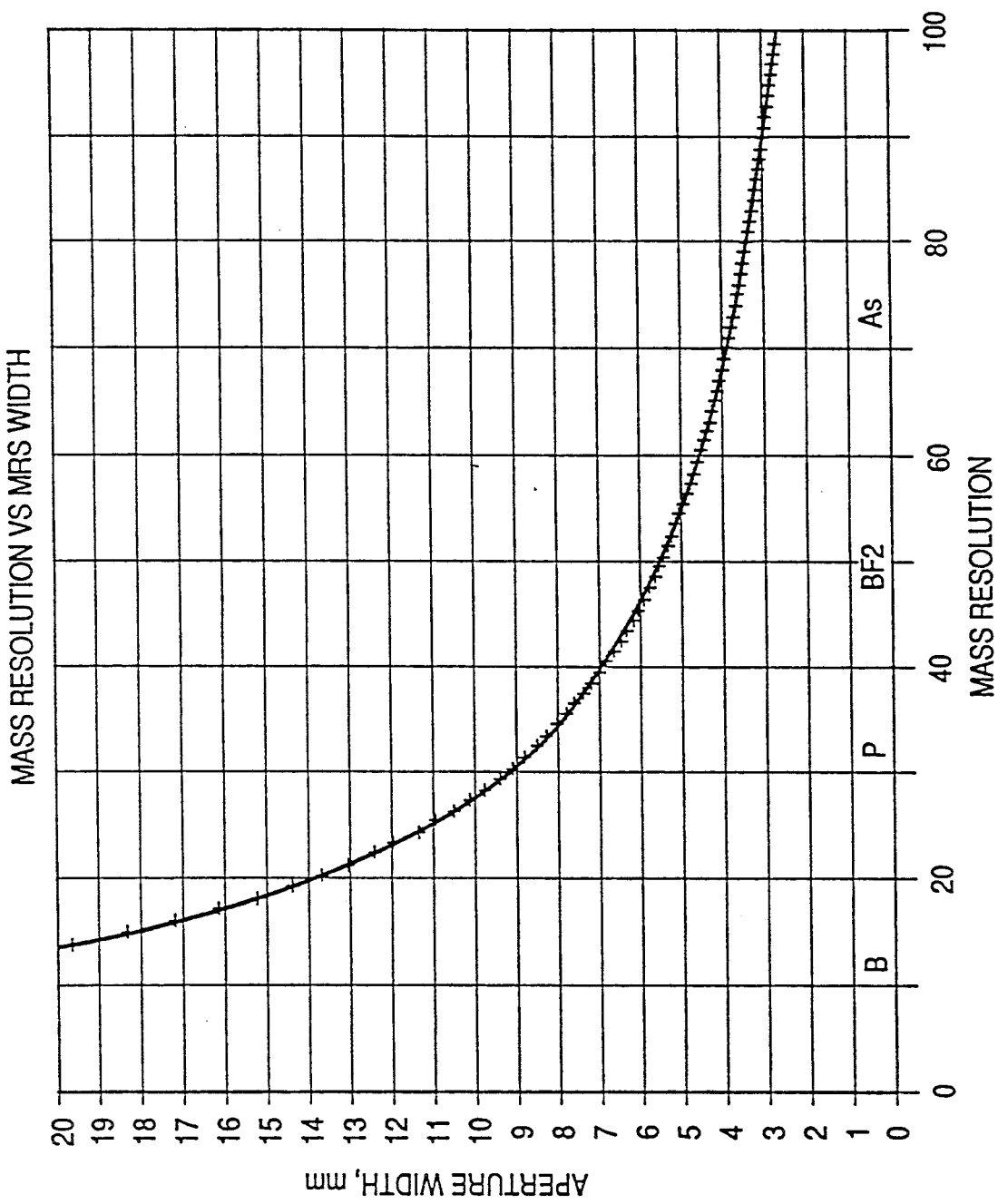
FIG. 5 is a graph of aperture size versus resolving power for a mass resolving system.

FIG. 5 is a graph showing the size of the aperture opening of a mass resolving system versus mass resolution. The size of the aperture can be adjusted according to the mass of the ion species to be transmitted.

Thus by incorporating the variable mass resolving system of the invention into standard ion implantation equipment, the aperture can be preset quickly and accurately so that more beam current can be transmitted in the ion beam striking the wafer to be implanted, with its accompanying advantages to the process.

Other variations will suggest themselves to those skilled in the art and are meant to be included herein. The invention is meant only to be limited by the scope of the appended claims.

We claim:

1. A method for implanting ions of a preselected chemical species into a semiconductor wafer to a target total dose level comprising the steps of:

disposing in an ion beam line an ion source chamber having an ion emitting aperture defined therein;

supplying vapor containing said preselected species to said ion source chamber;

operating said ion source chamber to create a stable plasma of ions of said preselected species therewithin;

extracting a beam of ions through said aperture in said chamber;

analyzing said beam of ions on the basis of mass to produce analyzed ion beams;

adjustably resolving said analyzed ion beam by varying the width of an aperture of a resolving system into a beam containing ions of said preselected chemical species including more than one isotope of said preselected species.

accelerating the resolved ion beam to a preselected energy; and directing the accelerated beam including said isotopes toward a beam collecting means.

2. A method according to claim 1 wherein said beam collecting means is a semiconductor wafer.

3. A method according to claim 1 wherein said species includes isotopes of antimony.

4. A method according to claim 1 wherein said species includes isotopes of boron.

5. A method according to claim 3 wherein said isotopes of antimony include antimony 121 and antimony 123.

6. A method according to claim 4 wherein said isotopes of boron include boron 10 and boron 11.

7. A method of increasing the beam current during ion implantation of a preselected ion species containing more than one isotope of said species in the beam comprising increasing the width of the mass resolving aperture of an ion implanter so as to allow more than one isotope of said ion species to pass through the aperture.

8. A method according to claim 7 wherein said ion species is boron and said isotopes include $B_{10}$ and $B_{11}$.

9. A method according to claim 7 wherein said ion species is antimony and said isotopes include $Sb_{121}$ and $Sb_{123}$.

* * * * *